US012757563B2

(12) United States Patent
Chen et al.

(10) Patent No.: US 12,757,563 B2
(45) Date of Patent: Oct. 6, 2026

(54) PEROVSKITE CELL, PHOTOVOLTAIC MODULE, PHOTOVOLTAIC POWER GENERATION SYSTEM AND ELECTRICAL DEVICE

(71) Applicant: CONTEMPORARY AMPEREX TECHNOLOGY CO., LIMITED, Ningde (CN)

(72) Inventors: Changsong Chen, Ningde (CN); Bao Tu, Ningde (CN); Wenming Guo, Ningde (CN); Ruoxuan Shi, Ningde (CN); Xiao Liu, Ningde (CN); Limei Zhou, Ningde (CN); Yongsheng Guo, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 19/328,230

(22) Filed: Sep. 15, 2025

(65) Prior Publication Data

US 2026/0013316 A1 Jan. 8, 2026

Related U.S. Application Data

(63) Continuation of application No. PCT/CN2023/090690, filed on Apr. 25, 2023.

(51) Int. Cl.
*H10K 30/87* (2023.01)
*H10K 30/40* (2023.01)

(52) U.S. Cl.
CPC ............. *H10K 30/87* (2023.02); *H10K 30/40* (2023.02)

(58) Field of Classification Search
CPC ............................... H10K 30/87; H10K 30/40
See application file for complete search history.

(56) References Cited

U.S. PATENT DOCUMENTS

2012/0132930 A1* 5/2012 Young .................. H05K 1/0313 257/E31.127
2013/0168228 A1* 7/2013 Ozin ........................ B01J 35/39 977/773

(Continued)

FOREIGN PATENT DOCUMENTS

CN 105428541 A 3/2016
CN 106867204 A 6/2017

(Continued)

OTHER PUBLICATIONS

Jiang (Year: 2017).*

(Continued)

*Primary Examiner* — Sadie White
(74) *Attorney, Agent, or Firm* — K&L Gates LLP

(57) ABSTRACT

The present application relates to the technical field of photovoltaics, and provides a perovskite cell, a photovoltaic module, a photovoltaic power generation system and an electrical device. The perovskite cell includes: a wide absorption spectrum perovskite layer located between a transparent substrate layer and an electrode layer, wherein the wide absorption spectrum perovskite layer includes a three-dimensional perovskite and a light-conversion material, at least part of the light-conversion material is distributed in the intergranular gaps of the three-dimensional perovskite, and the light-conversion material includes at least one of an up-conversion material and a down-conversion material. The present application can alleviate the technical problems of a low solar spectrum utilization rate and a low energy conversion efficiency of the existing perovskite cells.

15 Claims, 2 Drawing Sheets

(56) References Cited

U.S. PATENT DOCUMENTS

| | | | | |
|---|---|---|---|---|
| 2016/0141535 A1* | 5/2016 | Snaith | H10K 71/12 | |
| | | | 438/82 | |
| 2018/0166504 A1* | 6/2018 | Kamino | H10K 30/57 | |
| 2023/0119125 A1* | 4/2023 | March | H10K 85/50 | |
| | | | 136/259 | |

FOREIGN PATENT DOCUMENTS

| | | | |
|---|---|---|---|
| CN | 107528002 | A | 12/2017 |
| CN | 109671847 | A | 4/2019 |
| CN | 110854271 | A | 2/2020 |
| CN | 115411125 | A | 11/2022 |
| EP | 3996151 | A1 | 5/2022 |

OTHER PUBLICATIONS

Jin (Year: 2017).*
Jin (Year: 2018).*
Lai (Year: 2017).*
Xu (Year: 2021).*
Hou (Year: 2016).*
Li, et al., Journal of Luminescence, 2013, 134, 59-62 (Year: 2013).*
Vu, et al., J. Mater. Chem. A, 2015, 3, 11130- Supplemental (Year: 2015).*
Vu, et al., J. Mater. Chem. A, 2015, 3, 11130 (Year: 2015).*
The International Search Report received in the counterpart PCT application PCT/CN2023/090690, mailed on Jun. 14, 2023, 5 pages with English translation.
The Written Opinion of ISA received in the counterpart PCT application PCT/CN2023/090690, mailed on Jun. 14, 2023, 5 pages with English translation.
Extended European Search Report, mailed Apr. 30, 2026, for corresponding European Patent Application Serial No. 23934450.0.
Wu et al., "Understanding the efficiency enhancement of perovskite solar cells with NaGdF4: Er3+/Yb3+ nanorods", Solar Energy Materials and Solar Cells, vol. 248, Dec. 2022, 112029, 9 pages.
Alkahtani et al., "High-performance and stable perovskite solar cells using carbon quantum dots and upconversion nanoparticles", International Journal of Molecular Sciences, 2022, 23, 14441, 12 pages.
Xu et al., "High-Performance Perovskite Solar Cells Based on NaCsWO3@ NaYF4@NaYF4:Yb, Er Upconversion Nanoparticles", ACS Appl. Mater. Interfaces, 2021, 13, pp. 2674-2684.
Lai et al., "Broadband dye-sensitized upconverting nanocrystals enabled near-infrared planar perovskite solar cells", Journal of Power Sources, vol. 372, Dec. 31, 2017, pp. 125-133.
Office Action (with English Machine Translation), mailed Aug. 12, 2026, for corresponding Japanese Patent Application Serial No. 2025-550465.

* cited by examiner

PEROVSKITE CELL, PHOTOVOLTAIC MODULE, PHOTOVOLTAIC POWER GENERATION SYSTEM AND ELECTRICAL DEVICE

TECHNICAL FIELD

The present application relates to the technical field of photovoltaics, and in particular, to a perovskite cell, a photovoltaic module, a photovoltaic power generation system and an electrical device.

BACKGROUND

Perovskite materials can effectively absorb solar energy as light-absorbing layers, but the optical band gap of light-absorbing layer materials (such as perovskites) in conventional photovoltaic devices is fixed, so their absorption spectrum is fixed, which cannot maximize the utilization of the solar spectrum, causing energy loss and affecting energy conversion efficiency.

SUMMARY OF THE INVENTION

The present application provides a perovskite cell, a photovoltaic module, a photovoltaic power generation system and electrical device, which can alleviate the technical problems of a low solar spectrum utilization rate and a low energy conversion efficiency of the existing perovskite cells.

In a first aspect, an embodiment of the present application provides a perovskite cell, including: a wide absorption spectrum perovskite layer located between a transparent substrate layer and an electrode layer, wherein the wide absorption spectrum perovskite layer includes a three-dimensional perovskite and a light-conversion material, at least part of the light-conversion material is distributed in the intergranular gaps of the three-dimensional perovskite, and the light-conversion material includes at least one of an up-conversion material and a down-conversion material.

In the technical solution of the embodiment of the present application, a light-conversion material is introduced into the wide absorption spectrum perovskite layer, and the solar spectrum is converted by using the light-conversion material such that the emitted spectrum is within the absorption spectrum range of the three-dimensional perovskite, thereby broadening the absorption light band of the wide absorption spectrum perovskite layer, effectively improving the utilization rate of the solar spectrum, and improving the energy conversion efficiency of the perovskite cell. The arrangement of distributing at least part of the light-conversion material in the intergranular gaps of the three-dimensional perovskite is beneficial to reducing the number of heterogeneous interfaces, lowering the overall series resistance of the device, maintaining the intrinsic structural advantages of the perovskite cell, reducing the process complexity, alleviating the defects caused by the introduction of interfaces, and forming a bulk structure, which facilitates the full absorption of solar photons and improvement of the energy conversion efficiency.

In some embodiments, the light-conversion material includes an up-conversion material and a down-conversion material. The up-conversion material is used to absorb long-wavelength (low-energy) photons and convert them into visible light bands that can be effectively absorbed by the three-dimensional perovskites. The down-conversion material is used to absorb short-wavelength (high-energy) photons and convert them into visible light bands that can be effectively absorbed by three-dimensional perovskites. This allows the spectrum emitted by the light-conversion material to be within the absorption spectrum range of the three-dimensional perovskite. The absorption spectrum of the perovskite can be broadened to the infrared and ultraviolet bands at the same time, which facilitates the improvement of the utilization rate of the solar spectrum and the improvement of the energy conversion efficiency.

In some embodiments, the mass ratio of the up-conversion material to the down-conversion material is 1:6-6:1. Controlling an appropriate mass ratio of the up-conversion material to the down-conversion material is beneficial to improving the energy conversion efficiency and avoiding the influence of the utilization rate of the solar spectrum and the energy conversion efficiency due to the addition of too much or too little of any conversion material.

In some embodiments, based on the mass of the wide absorption spectrum perovskite layer, the percentage mass content of the up-conversion material is less than or equal to 6%, optionally 1-6%. Controlling a reasonable percentage mass content of the up-conversion material in the wide absorption spectrum perovskite layer is beneficial to improving the energy conversion efficiency of the wide absorption spectrum perovskite layer.

In some embodiments, based on the mass of the wide absorption spectrum perovskite layer, the percentage mass content of the down-conversion material is less than or equal to 6%, optionally 1-6%. Controlling a reasonable percentage mass content of the down-conversion material in the wide absorption spectrum perovskite layer is beneficial to improving the energy conversion efficiency of the wide absorption spectrum perovskite layer.

In some embodiments, the up-conversion material is capable of converting light with a wavelength greater than 800 nm into visible light with a wavelength less than 800 nm. That is, the up-conversion material can convert light with a wavelength greater than 800 nm into visible light with a wavelength less than 800 nm for absorption by the three-dimensional perovskite, thereby improving the utilization rate of sunlight.

In some embodiments, the up-conversion material includes at least one of the following components: $NaLuF_4$, $NaGdF_4$, $NaYbF_4$, NaYGd, NaYLu, NaYNd, $NaGd(WO_4)_2$, LiErF, $BaYF_5$, $BaLuF_5$, $BaGdF_5$, $BaYb_2F$, CaS, $LiLa(MoO_4)_2$, $Gd_2O_3$, ZrYO, YAIO, $CaWO_4$, 2,4,5,6-tetrakis (9H-carbazol-9-yl) isophthalonitrile, thioxanthone, triphenylamine, and a rare earth element dopant and derivative of each of the above components.

Optionally, the rare earth element includes at least one of Yb, Er, Tm, Eu, Sm, Bi and Ho. The above-mentioned up-conversion material can convert sunlight into light with a wavelength that can be absorbed by the three-dimensional perovskite, thereby improving the utilization rate of sunlight, and can be provided independently of the three-dimensional perovskite and distributed in the intergranular gaps of the three-dimensional perovskite.

In some embodiments, the down-conversion material is capable of converting light with a wavelength less than 400 nm into visible light with a wavelength greater than 400 nm. That is, the down-conversion material can convert light with a wavelength less than 400 nm into visible light with a wavelength greater than 400 nm for absorption by the three-dimensional perovskite, which cannot only improve the utilization rate of the sunlight, but also avoid the damage caused by the light with a wavelength less than 400 nm being directly absorbed by the three-dimensional perovskite.

In some embodiments, the down-conversion material includes at least one of a fluorescent material, a phosphorescent material, and a thermally activated delayed fluorescent material.

Optionally, the fluorescent material includes at least one of the following components: riboflavin, phycoerythrin, a metal complex, a polyfluorene compound, a coumarin compound, a naphthalimide compound, a triacene or higher acene compound, a rhodamine compound, a fluorescein compound, a fluoroboron-dipyrrole compound, a resorufin compound, a pyrazoline compound, a triphenylamine compound, a carbazole compound, a green fluorescent protein, a diamine fluorescent compound, and a perovskite luminescent nanomaterial.

Optionally, the phosphorescent material includes a matrix and an activator, and the matrix includes at least one of a sulfide, an oxide, a selenide, a fluoride, phosphates, a silicate and a tungstate of a Group II metal, and the activator includes a heavy metal.

optionally, in the phosphorescent material, the heavy metal includes at least one of Au, Cu, Mn, Ag, Bi, Pb and a rare earth metal. The above-mentioned fluorescent materials and phosphorescent materials both can convert sunlight into light with a wavelength that can be absorbed by the three-dimensional perovskite, thereby improving the utilization rate of sunlight. They can also be provided independently of the three-dimensional perovskite and distributed in the intergranular gaps of three-dimensional perovskite.

In some embodiments, at least part of the light-conversion material is in a granular form and dispersed in the three-dimensional perovskite while maintaining a granular morphology. Optionally, the D90 particle size of the light-conversion material is less than or equal to 40 nm. The above configuration is beneficial to distributing the light-conversion material in the intergranular gaps of the three-dimensional perovskite, thereby reducing the adverse effects of particles on the three-dimensional perovskite.

In some embodiments, the thickness of wide absorption spectrum perovskite layer is 400-600 nm. Controlling a reasonable thickness of the wide absorption spectrum perovskite layer to avoid being too thick or too thin to affect the separation of carriers is beneficial to improving the energy conversion efficiency.

In some embodiments, the wide absorption spectrum perovskite layer has an absorption spectrum of 300-1100 nm. That is, the absorption spectrum of the wide absorption spectrum perovskite layer is broadened to the infrared and ultraviolet bands, thereby increasing the utilization rate of the solar spectrum and greatly improving the performance of the perovskite cell.

In some embodiments, the perovskite cell includes a transparent substrate layer, a first carrier transport layer, a wide absorption spectrum perovskite layer, a second carrier transport layer and an electrode layer stacked in sequence; either the first carrier transport layer or the second carrier transport layer is an electron transport layer, and the other is a hole transport layer. The above-mentioned perovskite cell has a simple structure and is easy to prepare.

In a second aspect, the present application provides a photovoltaic module, including the perovskite cell in the above embodiment.

In a third aspect, the present application provides a photovoltaic power generation system, including several electrically connected photovoltaic modules in the above-mentioned embodiments.

In a fourth aspect, the present application provides an electrical device including several electrically connected photovoltaic modules in the above embodiments.

The above description is only an overview of the technical solution of the present application. In order to better understand the technical means of the present application and thus implement them according to the contents of the specification, and in order to make the aforementioned and other objectives, features and advantages of the present application more obvious and understandable, a detailed description of the present application is given hereinafter.

BRIEF DESCRIPTION OF DRAWINGS

By reading the detailed description of the preferred embodiments below, various other advantages and benefits will become apparent to those of ordinary skill in the art. The drawings are used for the purpose of illustrating the preferred embodiments only and are not to be considered a limitation to the present application. Moreover, in all of the drawings, like reference numerals represent like components.

In the accompanying drawings.

Figure 1:
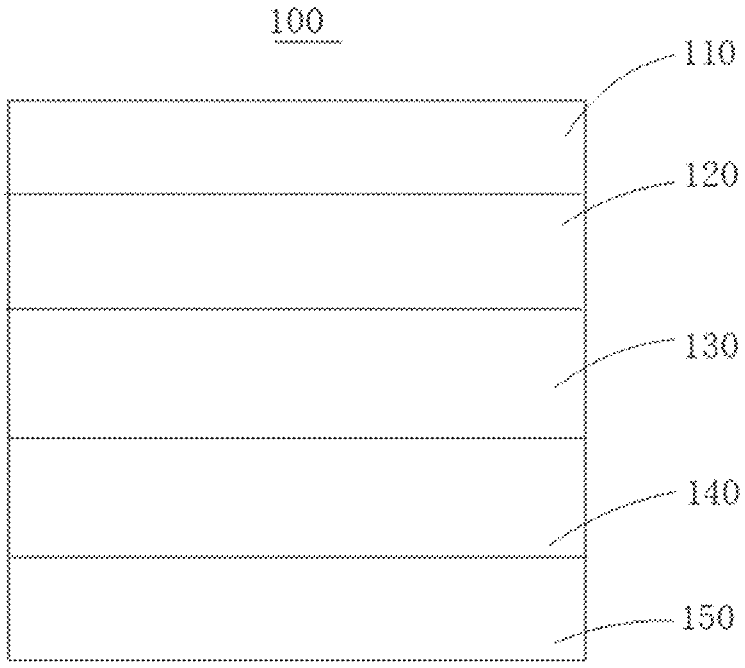
FIG. 1 is a schematic structural diagram of a first perovskite cell provided in an embodiment of the present application.

icon:

1000—photovoltaic module;

1100—battery string; 1200—front glass; 1300—front encapsulation film; 1400—back encapsulation film; 1500—back glass;

100—perovskite cell;

110—transparent substrate layer; 120—first carrier transport layer; 130—wide absorption spectrum perovskite layer; 140—second carrier transport layer; and 150—electrode layer.

DETAILED DESCRIPTION

Embodiments of the technical solutions of the present application will be described in detail below with reference to the accompanying drawings. The following embodiments are only used to more clearly illustrate the technical solutions of the present application, therefore only as examples, and cannot be used to limit the scope of protection of the present application.

Unless otherwise defined, all technical and scientific terms used herein have the same meanings as those commonly understood by those skilled in the art to which the present application pertains to. The terms used herein are for the purpose of describing specific embodiments only and are not intended to limit the present application. The terms "including" and "having" and any variations thereof in the specification and claims of the present application and the aforementioned BRIEF DESCRIPTION OF DRAWINGS are intended to cover non-exclusive inclusion.

In the description of the embodiments of the present application, the technical terms "first", "second", etc., are used only to distinguish between different objects and are not to be understood as indicating or implying a relative importance or implicitly specifying the number, particular order, or primary and secondary relationship of the technical features indicated. In the description of the embodiments of the present application, the meaning of "a plurality of" is two or more, unless otherwise explicitly and specifically defined.

Reference herein to "an embodiment" means that a particular feature, structure, or characteristic described in connection with the embodiment can be included in at least one embodiment of the present application. The appearance of this phrase in various places in the specification does not necessarily refer to the same embodiment, nor is it a separate or alternative embodiment that is mutually exclusive with other embodiments. It is explicitly and implicitly understood by those skilled in the art that the embodiments described herein may be combined with other embodiments.

In the description of the embodiments of the present application, the term "and/or" is merely a term used to describe the association relationship between associated objects, indicating that three relationships may exist. For example, A and/or B may represent three situations: A exists alone, A and B exist at the same time, and B exists alone.

In the description of the embodiments of the present application, the term "a plurality of" refers to two or more (including two). Similarly, "a plurality of groups" refers to two or more (including two) groups, and "a plurality of sheets" refers to two or more (including two) sheets.

In the description of the embodiments of the present application, the technical terms "thickness", "top", "bottom", "outer", "inner", and the like indicate orientations or positional relationships based on the orientations or positional relationships shown in the drawings, and are intended only to facilitate and simplify the description of the embodiments of the present application, and are not intended to indicate or imply that the apparatus or element referred to must have a particular orientation, or be constructed and operated in a particular orientation, and therefore should not be construed as limitation of the embodiments of the present application.

In the description of the embodiments of the present application, unless otherwise specified and limited, the technical terms "mounting", "connection" and the like, should be understood in a broad sense, for example, they can be fixed connection, detachable connection, or integration; or they can be mechanical connection or electrical connection; or they can be direct connection, indirect connection through an intermediate medium, or communication of the interiors of two elements or the relationship of interaction between two elements. Those ordinarily skilled in the art may understand the specific meanings of the above terms in the embodiments of the present application according to the specific situations.

As a green energy battery, solar cells are now being used more and more widely from the perspective of market development. Among the applications, solar cells are not only used in photovoltaic power generation systems such as solar power stations, but are also gradually being used in electrical device such as electric vehicles. With the continuous expansion of the application field of solar cells, the market demand thereof is also constantly expanding.

Perovskite solar cells have become the most widely studied and applied solar cells in recent years due to their advantages such as a high energy conversion efficiency and a low power generation cost. In the perovskite solar cell, the light-absorbing layer is mainly composed of a perovskite material. When exposed to sunlight, the perovskite layer first absorbs photons to generate electron-hole pairs (excitons). Under the action of the p-n junction electric field, the excitons are first separated into electrons and holes and transported to the cathode and anode respectively. Photogenerated holes flow to the p region, and photogenerated electrons flow to the n region. When the circuit is connected, a current is generated.

However, in current perovskite solar cells, the optical band gap of the perovskite layer is fixed, and therefore its absorption spectrum is fixed, which cannot maximize the utilization of the solar spectrum. The long-wave band will directly pass the light-absorbing layer, and the short-wave band will be absorbed by the light-absorbing layer but will cause a relatively great damage to the material, resulting in the energy loss and affecting the energy conversion efficiency. In order to alleviate the above-mentioned problems, in some current designs it is desired to solve the above-mentioned problems by introducing an up-conversion film layer or a down-conversion film layer. However, the above-mentioned configuration process is complicated and cannot effectively improve the energy conversion efficiency. The possible reason is that the number of heterojunction interfaces is increased, the overall series resistance is increased, and a large number of defects are easily generated at the interface, thus leading to the above-mentioned problems.

Therefore, in the present application, the light-conversion material is distributed directly in the three-dimensional perovskite, which is beneficial to reducing the number of heterogeneous interfaces, avoids the defects introduced by the interface, reduces the overall series resistance of the device, maintains the intrinsic structural advantages of the perovskite cell, reduces the process complexity, and forms a bulk structure, which facilitates to the full absorption of the solar photons and the improvement of the energy conversion efficiency with few internal defects and stable device performance.

The technical solutions of the present application will be exemplarily described in conjunction with embodiments.

Figure 2:
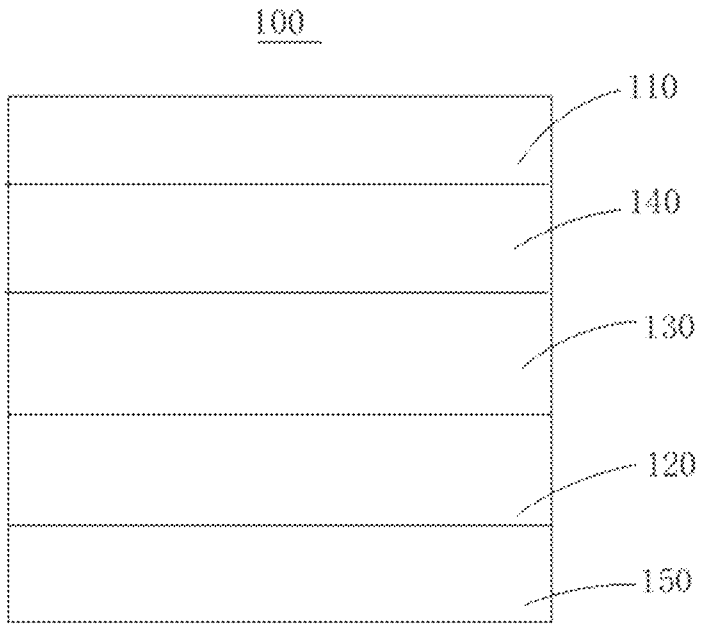
FIG. 2 is a schematic structural diagram of a second perovskite cell provided in an embodiment of the present application.

Referring to FIG. 1 and FIG. 2, according to some embodiments of the present application, the perovskite cell 100 includes: a wide absorption spectrum perovskite layer 130 located between a transparent substrate layer 110 and an electrode layer 150, the wide absorption spectrum perovskite layer 130 includes a three-dimensional perovskite and a light-conversion material, at least part of the light-conversion material is distributed in the intergranular gaps of the three-dimensional perovskite, and the light-conversion material includes at least one of an up-conversion material and a down-conversion material.

A three-dimensional perovskite refers to a perovskite in which the constituent ions are arranged in a three-dimensional space, to form a three-dimensional structure. The intergranular gaps of the three-dimensional perovskite refer to the gaps between the grains of the three-dimensional perovskite.

A light-conversion material refers to a photoluminescent material with an emission spectrum within the absorption spectrum of the three-dimensional perovskite. An up-conversion material, also known as an up-conversion luminescent material, refers to a material that converts two or more low-energy photons into one high-energy photon, thereby converting long-wavelength light into short-wavelength light. A down-conversion material, also known as a down-conversion luminescent material, refers to a material that can emit two or more low-energy photons after absorbing one high-energy photon, thereby converting short-wavelength light into long-wavelength light.

The light-conversion material includes at least one of an up-conversion material and a down-conversion material, which means that the light-conversion material is an up-conversion material, or a down-conversion material, or a mixture of the up-conversion material and the down-conversion material.

The spectrum emitted by the light-conversion material is within the absorption spectrum range of the three-dimensional perovskite, which means that the light emitted by the up-conversion material and/or the down-conversion material after having the absorbed photons converted can be absorbed by the three-dimensional perovskite.

At least part of the light-conversion material is distributed in the intergranular gaps of the three-dimensional perovskite, including: part of the light-conversion material is distributed on the surface of the three-dimensional perovskite, and the rest is distributed in the intergranular gaps of the three-dimensional perovskite, and also including the case where all the light-conversion material is distributed in the intergranular gaps of the three-dimensional perovskite.

In the technical solution of the embodiment of the present application, a light-conversion material is introduced, and the solar spectrum is converted by using the light-conversion material such that the emitted spectrum is within the absorption spectrum range of the three-dimensional perovskite, thereby broadening the absorption light band of the wide absorption spectrum perovskite layer 130, effectively improving the utilization rate of the solar spectrum, and improving the energy conversion efficiency of the perovskite cell 100. The arrangement of distributing at least part of the light-conversion material in the intergranular gaps of the three-dimensional perovskite is beneficial to reducing the number of heterogeneous interfaces, lowering the overall series resistance of the device, maintaining the intrinsic structural advantages of the perovskite cell 100, reducing the process complexity, alleviating the defects caused by the introduction of interfaces, and forming a bulk structure, which facilitates the full absorption of solar photons and improvement of the energy conversion efficiency.

Optionally, the three-dimensional perovskite satisfies general formula $ABX_3$, wherein A is an inorganic, organic or organic-inorganic hybrid cation, B is an inorganic, organic or organic-inorganic hybrid cation, and X is an inorganic, organic or organic-inorganic hybrid anion.

Herein, A is an inorganic, organic or organic-inorganic hybrid cation, which means that A is at least one of an inorganic cation and an organic cation.

As an example, as an example, A is selected from at least one of $CH_3NH_3^+$ (abbreviated as $MA^+$), $CH(NH_2)^{2+}$ (abbreviated as $FA^+$), $Li^+$, $Na^+$, $K^+$, $Rb^+$ and $Cs^+$; optionally, A is selected from at least one of $CH_3NH_3^+$, $CH(NH_2)^{2+}$ and $Cs^+$. As an example, B is selected from one or more of $Pb^{2+}$, $Sn^{2+}$, $Be^{2+}$, $Mg^{2+}$, $Ca^{2+}$, $Sr^{2+}$, $Ba^{2+}$, $Zn^{2+}$, $Ge^{2+}$, $Fe^{2+}$, $Co^{2+}$ and $Ni^{2+}$; optionally, B is selected from one or both of $Pb^{2+}$ and $Sn^{2+}$. As an example, X is selected from at least one of $F^-$, $Cl^-$, $Br^-$ and $I^-$; optionally, X is selected from at least one of $Cl^-$, $Br^-$ and $I^-$.

Optionally, the perovskite material includes one or more of $CH_3NH_3PbI_3$ (abbreviated as $MAPbI_3$), $CH(NH_2)_2PbI_3$ (abbreviated as $FAPbI_3$), $Cs_{0.05}$ $(FA_{0.83}MA_{0.17})_{0.95}Pb$ $(I_{0.83}Br_{0.17})_3$ (abbreviated as CsFAMA), $CsPbI_3$, $CsPbI_2Br$ and $CsPbIBr_2$.

Herein, the perovskite cell 100 is a perovskite solar cell, which generally includes functional layers such as a transparent substrate layer 110, a hole transport layer, a perovskite light absorption layer, an electron transport layer and an electrode layer 150. In the present application, a wide absorption spectrum perovskite layer 130 is used as the perovskite light absorption layer.

The types of the transparent substrate layer 110 include, but are not limited to, FTO (fluorine-doped $SnO_2$ transparent conductive glass), ITO (indium tin oxide transparent conductive glass), AZO (aluminum-doped zinc oxide transparent conductive glass), BZO (benzodiazepine transparent conductive glass), IZO (indium zinc oxide transparent conductive glass), etc.

The electron transport material used in the electron transport layer is, for example, but not limited to, at least one of an imide compound, a quinone compound, fullerene and a derivative thereof, a metal oxide, silicon oxide, strontium titanate, calcium titanate, lithium fluoride and calcium fluoride, wherein the metal element in the metal oxide used in the electron transport material includes at least one of Mg, Cd, Zn, In, Pb, W, Sb, Bi, Hg, Ti, Ag, Mn, Fe, V, Sn, Zr, Sr, Ga and Cr.

The thickness of the electron transport layer is, for example, 20-80 nm, optionally 30-60 nm.

The hole transport material used in the hole transport layer is, for example but not limited to, at least one of 2,2',7,7'-tetrakis(N,N-p-methoxyanilino)-9,9'-spirobifluorene, methoxytriphenylamine-fluoroformamidine, poly[bis(4-phenyl)(2,4,6-trimethylphenyl)amine], poly(3,4-ethylenedioxythiophene), polystyrene sulfonic acid, poly3-hexylthiophene, triphenylamine with triptycene as the core, 3,4-ethylenedioxythiophene-methoxytriphenylamine, N-(4-anilino) carbazole-spirobifluorene, polythiophene, a phosphate-based monomolecule, a carbazole-based monomolecule, a sulfonic acid-based monomolecule, a triphenylamine-based monomolecule, an aromatic monomolecule, a metal oxide and cuprous thiocyanate, wherein the metal element in the metal oxide used in the hole transport material includes at least one of Ni, Mo and Cu.

The thickness of the hole transport layer is 100-200 nm, optionally 130-170 nm.

The electrode layer 150 is made of an organic, inorganic or organic-inorganic hybrid conductive material, and the conductive material is at least one of an organic conductive material and an inorganic conductive material, wherein the organic conductive material is, for example, a conductive polymer, and the conductive polymer includes but is not limited to at least one of polyethylene dioxythiophene (PEDOT), polythiophene, polyacetylene, etc.; the inorganic conductive material is, for example, but not limited to, at least one of a transparent conductive oxide, a metal, a carbon derivative, etc., and the inorganic conductive material specifically includes, for example, Ag, Cu, C, Au, Al, ITO, AZO, BZO, IZO, etc.

According to some embodiments of the present application, the light-conversion material includes an up-conversion material and a down-conversion material.

That is, both the up-conversion material and the down-conversion material exist in the wide absorption spectrum perovskite layer 130, and the up-conversion material and the down-conversion material are respectively at least partially distributed in the intergranular gaps of the perovskite of the three-dimensional perovskite.

The up-conversion material is used to absorb long-wavelength (low-energy) photons and convert them into visible light bands that can be effectively absorbed by the three-dimensional perovskite. The down-conversion material is used to absorb short-wavelength (high-energy) photons and convert them into visible light bands that can be effectively absorbed by three-dimensional perovskite. The absorption spectrum of the perovskite can be broadened to the infrared and ultraviolet bands at the same time, which facilitates the improvement of the utilization rate of the solar spectrum and the improvement of the energy conversion efficiency of the perovskite cell 100.

According to some embodiments of the present application, the mass ratio of the up-conversion material to the down-conversion material is 1:6-6:1.

Controlling an appropriate mass ratio of the up-conversion material to the down-conversion material is beneficial to improving the utilization rate of the solar spectrum and the energy conversion efficiency.

Exemplarily, the mass ratio of the up-conversion material to the down-conversion material is any value of 1:5, 1:4, 1:3, 1:2, 1:1, 2:1, 3:1, 4:1, 5:1 or between any two values thereof.

According to some embodiments of the present application, based on the mass of the wide absorption spectrum perovskite layer 130, the percentage mass content of the up-conversion material is less than or equal to 6%.

That is, the doping amount of the up-conversion material in the wide absorption spectrum perovskite layer 130 is ≤6 wt %.

Controlling a reasonable percentage mass content of the down-conversion material in the wide absorption spectrum perovskite layer 130 is beneficial to improving the stability and the energy conversion efficiency of the wide absorption spectrum perovskite layer 130.

Exemplarily, based on the mass of the wide absorption spectrum perovskite layer 130, the percentage mass content of the up-conversion material is any value of 6%, 5%, 4%, 3%, 2%, 1%, 0.5%, or between any two values.

Optionally, based on the mass of the wide absorption spectrum perovskite layer 130, the percentage mass content of the up-conversion material is 1-6%.

According to some embodiments of the present application, based on the mass of the wide absorption spectrum perovskite layer 130, the percentage mass content of the down-conversion material is less than or equal to 6%.

That is, the doping amount of the down-conversion material in the wide absorption spectrum perovskite layer 130 is ≤6 wt %.

Controlling a reasonable doping amount of the down-conversion material in the wide absorption spectrum perovskite layer 130 is beneficial to improving the energy conversion efficiency of the wide absorption spectrum perovskite layer 130.

Exemplarily, based on the mass of the wide absorption spectrum perovskite layer 130, the percentage mass content of the down-conversion material is any one of 6%, 5%, 4%, 3%, 2%, 1%, 0.5%, or between any two values.

Optionally, based on the mass of the wide absorption spectrum perovskite layer 130, the percentage mass content of the down-conversion material is 1-6%.

According to some embodiments of the present application, the up-conversion material is capable of converting light with a wavelength greater than 800 nm into light with a wavelength less than 800 nm.

That is, the up-conversion material can convert light with a wavelength greater than 800 nm into light with a wavelength less than 800 nm for absorption by the three-dimensional perovskite, thereby improving the utilization rate of sunlight and avoiding some light with a wavelength greater than 800 nm from being directly absorbed by the three-dimensional perovskite, affecting the stability of the three-dimensional perovskite.

In some embodiments of the present application, the up-conversion material includes at least one of the following components: $NaLuF_4$, $NaGdF_4$, $NaYbF_4$, NaYGd, NaYLu, NaYNd, $NaGd(WO_4)_2$, LiErF, $BaYF_5$, $BaLuF_5$, $BaGdF_5$, $BaYb_2F$, CaS, $LiLa(MoO_4)_2$, $Gd_2O_3$, ZrYO, YAIO, $CaWO_4$, 2,4,5,6-tetrakis(9H-carbazol-9-yl) isophthalonitrile, thioxanthone, triphenylamine, and a rare earth element dopant and derivative of each of the above components.

The above-mentioned up-conversion material can convert sunlight into light with a wavelength that can be absorbed by the three-dimensional perovskite, thereby improving the utilization rate of sunlight, and can be provided independently of the three-dimensional perovskite and distributed in the intergranular gaps of the perovskite.

Optionally, the rare earth element includes at least one of Yb, Er, Tm, Eu, Sm, Bi and Ho.

According to some embodiments of the present application, the down-conversion material is capable of converting light with a wavelength less than 400 nm into visible light with a wavelength greater than 400 nm.

That is, the down-conversion material can convert light with a wavelength of <400 nm into visible light with a wavelength greater than 400 nm for absorption by the three-dimensional perovskite, which can not only improve the utilization rate of sunlight, but also avoid the damage caused by the light with a wavelength less than 400 nm being directly absorbed by the three-dimensional perovskite.

According to some embodiments of the present application, the down-conversion material includes at least one of a fluorescent material, a phosphorescent material, and a thermally activated delayed fluorescent material.

The fluorescent material, phosphorescent material, and thermally activated delayed fluorescent material all undergo light conversion under the excitation of excitation light to emit light with a wavelength greater than the excitation light.

Optionally, the fluorescent material includes at least one of the following components: riboflavin, phycoerythrin, a metal complex, a polyfluorene compound, a coumarin compound, a naphthalimide compound, a triacene or higher acene compound, a rhodamine compound, a fluorescein compound, a fluoroboron-dipyrrole compound, a resorufin compound, a pyrazoline compound, a triphenylamine compound, a carbazole compound, a green fluorescent protein, a diamine fluorescent compound, and a perovskite luminescent nanomaterial.

It should be noted that the above material is not particularly limited and is a fluorescent material commonly used in the art.

The metal complex may be at least one of tris(2-phenylpyridine)iridium, tris(dibenzoylmethane)mono(1,10-phenanthroline)europium, tris(2-phenylpyrimidine)iridium, and the like.

The polyfluorene compound refers to polyfluorene with a fluorescent effect and a derivative thereof. The polyfluorene compound includes but is not limited to poly(9,9-dialkylfluorene), a copolymer of bishexylfluorene and anthracene, a side chain containing branched biphenyl, a tetraalkyl-substituted indenofluorene polymer, an aryl-substituted indenofluorene polymer, a polyfluorene-bithiophene alternating copolymer, and a binary and a ternary random copolymer of fluorene and thiophene, ethylenedioxythiophene, 4,7-bithiophene-2,1,3-benzothiadiazole, and 4,7-bithiophene-2, 1,3-benzoselenadiazole.

The coumarin compound refers to coumarin and a derivative thereof. The coumarin compound includes but is not limited to at least one of coumarin 307, coumarin 6, coumarin 153, coumarin 343, coumarin 152, coumarin 153, coumarin 7, coumarin 334, coumarin 314, coumarin 102, 7-ethoxycoumarin, 7-diethylamino-3-(2-benzimidazole) coumarin, 7-hydroxy-4-trifluoromethylcoumarin, 7-diethylamino-4-methylcoumarin, etc.

The naphthalimide compound refers to a compound having a naphthalimide fluorescent group, and the naphthalimide compound includes but is not limited to 4-amino-1,8-naphthalimide. The triacene or higher acene compound refers to anthraceneor a higher acene, and a derivative thereof. The triacene or higher acene compound includes but is not limited to at least one of anthracene, coronene, perylene, benzanthracene, and the like.

The rhodamine compound refers to rhodamine and a derivative thereof. The rhodamine compound includes but is not limited to at least one of tetraethyl rhodamine, tetramethylrhodamine isothiocyanate, rhodamine 6G (Acros Company), rhodamine 123, rhodamine B, rhodamine 110, and the like.

The fluorescein compound includes but is not limited to at least one of fluorescein sodium, fluorescein yellow, fluorescein diacetate, 5-aminofluorescein, 2',7'-dichlorofluorescein, fluorescein diacetate, tetraiodofluorescein, 6-carboxyfluorescein, 4',5'-dibromofluorescein, fluorescein isothiocyanate, and the like.

The fluoroboron-dipyrrole compound refers to fluoroboron-dipyrrole and a derivative thereof.

The resorufin compound refers to resorufin and a derivative thereof. The resorufin compound includes but is not limited to at least one of hydrogenated resorufin and resorufin α-D-pyranoglucoside.

The pyrazoline compound refers to a fluorescent material containing a pyrazoline group, including but not limited to at least one of 5-diphenyl-3-(4-chloro) phenyl-2-pyrazoline, cyclic polypyrazoline-carboxamide, and the like.

The triphenylamine compound refers to triphenylamine and a derivative thereof, including but not limited to 4'-(diphenylamine)-(1,1'-biphenyl)$_4$-carboxaldehyde.

The carbazole compound refers to a fluorescent material containing a carbazole group, including but not limited to at least one of 4,4'-N,N'-dicarbazole-biphenyl, 4,4',4"-tri (carbazol-9-yl)triphenylamine and 9,9'-(1,3-phenylene) bis-9H-carbazole.

The diamine fluorescent compound includes but is not limited to at least one of N,N'-bis-(3-methylphenyl)-N,N'-diphenyl-[1,1'-biphenyl]-4,4'-diamine or N,N'-bis(3-naphthyl)-N,N'-diphenyl-[1,1'-diphenyl]-4,4'-diamine.

The thermally activated delayed fluorescence (TADF) material, by ingenious molecular design, have a smaller minimum single-triplet energy level difference, such that the triplet excitons can return to the singlet state through reverse intersystem crossing, and then emit light by radiation transition to the ground state, thereby both the single and triplet excitons being used and achieving a quantum efficiency of 100%. The thermally activated delayed fluorescent material includes but is not limited to at least one of the blue light molecule P-Ac95-TRZ05, red light CRA-TXO-TPA (100), green light CRA-PXZ-Trz, and the like.

Optionally, the phosphorescent material includes a matrix and an activator, and the matrix includes at least one of a sulfide, an oxide, a selenide, a fluoride, phosphates, a silicate and a tungstate of a Group II metal, and the activator includes a heavy metal.

Optionally, in the phosphorescent material, the heavy metal includes at least one of Au, Cu, Mn, Ag, Bi, Pb and a rare earth metal.

The above-mentioned fluorescent materials and phosphorescent materials both can convert sunlight into light with a wavelength that can be absorbed by the three-dimensional perovskite, thereby improving the utilization rate of sunlight. The materials can also be provided independently of the three-dimensional perovskite and distributed in the intergranular gaps of the perovskite.

According to some embodiments of the present application, at least part of the light-conversion material is in a granular form and dispersed in the three-dimensional perovskite while maintaining a granular morphology.

At least part of the light-conversion material is in a granular form and dispersed in the three-dimensional perovskite while maintaining a granular morphology, which means that the morphology of the light-conversion material does not change during the process of preparing the wide absorption spectrum perovskite layer 130. For example, when the wide absorption spectrum perovskite layer 130 is prepared by coating a slurry containing the three-dimensional perovskite and the light-conversion material, the light-conversion material will not dissolve in the slurry.

Optionally, the D90 particle size of the light-conversion material is less than or equal to 40 nm.

It can be understood that the above-mentioned light-conversion material refers to a light-conversion material that is in a granular form and dispersed in a three-dimensional perovskite while maintaining a granular morphology.

The D90 particle size refers to a particle size distribution parameter of the light-conversion material determined by a particle size distribution measurement value. For example, Dv90 is determined by a particle size analyzer-laser diffraction method. Specifically, referring to the standard GB/T 19077-2016, a laser diffraction scattering particle size analyzer is used for measurement. The above configuration is beneficial to distributing the light-conversion material in the intergranular gaps of the perovskite of the three-dimensional perovskite, thereby reducing the adverse effects of particles on the three-dimensional perovskite.

Exemplarily, the particle size of the particles is any value of 40 nm, 30 nm, 28 nm, 26 nm, 25 nm, 20 nm, 18 nm, 15 nm, 10 nm, 5 nm, etc., or between any two values thereof.

Optionally, the D90 particle size of the light-conversion material is 10-40 nm.

Optionally, the D90 particle size of the light-conversion material is 10-30 nm.

According to some embodiments of the present application, the thickness of the wide absorption spectrum perovskite layer 130 is 400-600 nm.

It can be understood that the thickness of the wide absorption spectrum perovskite layer 130 refers to the size of the wide absorption spectrum perovskite layer 130 in the thickness direction of the perovskite cell 100, and the thickness direction of the perovskite cell 100 also refers to the direction in which the functional layers are stacked in sequence.

Controlling a reasonable thickness of the wide absorption spectrum perovskite layer 130 is beneficial to improving the energy conversion efficiency.

Exemplarily, the thickness of the wide absorption spectrum perovskite layer 130 is any value of 400 nm, 250 nm, 500 nm, 550 nm, 600 nm, etc., or is between any two values thereof.

According to some embodiments of the present application, the absorption spectrum of the wide absorption spectrum perovskite layer 130 is 300-1100 nm.

That is, the absorption spectrum of the wide absorption spectrum perovskite layer 130 is broadened to the infrared and ultraviolet bands, thereby increasing the utilization rate of the solar spectrum and greatly improving the performance of the perovskite cell 100.

Referring to FIG. 1 and FIG. 2, according to some embodiments of the present application, the perovskite cell 100 includes a transparent substrate layer 110, a first carrier transport layer 120, a wide absorption spectrum perovskite layer 130, a second carrier transport layer 140, and an electrode layer 150; either the first carrier transport layer 120 or the second carrier transport layer 140 is an electron transport layer, and the other is a hole transport layer.

As shown in FIG. 1, when the first carrier transport layer 120 is an electron transport layer and the second carrier transport layer 140 is a hole transport layer, the perovskite cell 100 is of a normal structure.

As shown in FIG. 2, when the first carrier transport layer 120 is a hole transport layer and the second carrier transport layer 140 is a hole transport layer, the perovskite cell 100 is of an inverted structure.

By using the arrangement of multiple functional layers stacked in sequence (the functional layers include a transparent substrate layer 110, a first carrier transport layer 120, a wide absorption spectrum perovskite layer 130, a second carrier transport layer 140 and an electrode layer 150 arranged in sequence), the perovskite cell 100 formed has a simple structure and is easy to prepare, while maintaining the intrinsic advantages of the perovskite cell 100.

Exemplarily, based on the above embodiment, the preparation process of the perovskite cell 100 includes: step 1: etching and cleaning the transparent substrate layer 110, and blowing it to dry for use; step 2: preparing a first carrier transport layer 120 on the front side of the transparent substrate layer 110, for use; step 3: preparing a wide absorption spectrum perovskite layer 130 on the front side of the first carrier transport layer 120, for use; step 4: preparing a second carrier transport layer 140 on the front side of the wide absorption spectrum perovskite layer 130, for use; step 5: preparing an electrode layer 150 on the front side of the second carrier transport layer 140, and performing edge bead removal for test.

It can be understood that the preparation methods for the above-mentioned layers include but are not limited to chemical bath deposition, electrochemical deposition, chemical vapor deposition, physical epitaxial growth, thermal evaporation co-evaporation, atomic layer deposition, magnetron sputtering, precursor solution coating, precursor solution slit coating, precursor solution knife coating, etc. A person skilled in the art can make a choice according to actual needs. In addition to the above-mentioned methods, a mechanical laminating method can also be used to form at least two interconnected functional layers at one time.

Optionally, each layer is prepared by, for example, a thermal evaporation method or a precursor solution coating method, wherein the precursor solution coating method may be a spin coating method.

It should be noted that, during the process of forming the wide absorption spectrum perovskite layer 130, if a precursor solution coating method is used, the perovskite coating solution used for the wide absorption spectrum perovskite layer 130 contains the dispersed conversion material and three-dimensional perovskite.

The method for preparing the above-mentioned perovskite cell 100 by combining the precursor solution coating and vacuum evaporation includes:

an electron transport layer slurry is spin-coated at a rotation speed of 4000 rpm-6500 rpm, and then dried on a constant temperature hot stage at, for example, 100-200° C. to obtain the electron transport layer.

a perovskite coating solution is spin-coated at a rotation speed of 3000 rpm-4500 rpm, and then moved to a constant temperature hot stage to dry at 80-120° C., and cooled to room temperature to form a wide absorption spectrum perovskite layer 130.

a hole transport layer slurry is spin-coated at a rotation speed of 3000 rpm-4000 rpm, and dried to obtain a hole transport layer.

The electrode layer 150 is evaporated under a vacuum condition of 5×10-4 Pa using a vacuum coating machine.

Referring to FIGS. 1 and 2, in some exemplary embodiments of the present application, the perovskite cell 100 includes a transparent substrate layer 110, a first carrier transport layer 120, a wide absorption spectrum perovskite layer 130, a second carrier transport layer 140 and an electrode layer 150 which are stacked in sequence. Either one of the first carrier transport layer 120 and the second carrier transport layer 140 is an electron transport layer, and the other is a hole transport layer. The wide absorption spectrum perovskite layer 130 includes a three-dimensional perovskite and a light-conversion material. At least part of the light-conversion material is distributed in the intergranular gaps of the three-dimensional perovskite. The light-conversion material is a mixture of an up-conversion material and a down-conversion material. Based on the mass of the wide absorption spectrum perovskite layer, the percentage mass content of the up-conversion material is less than or equal to 6%, the percentage mass content of the down-conversion material is less than or equal to 6%, and the mass ratio of the up-conversion material to the down-conversion material is 1:6-6:1.

Figure 3:
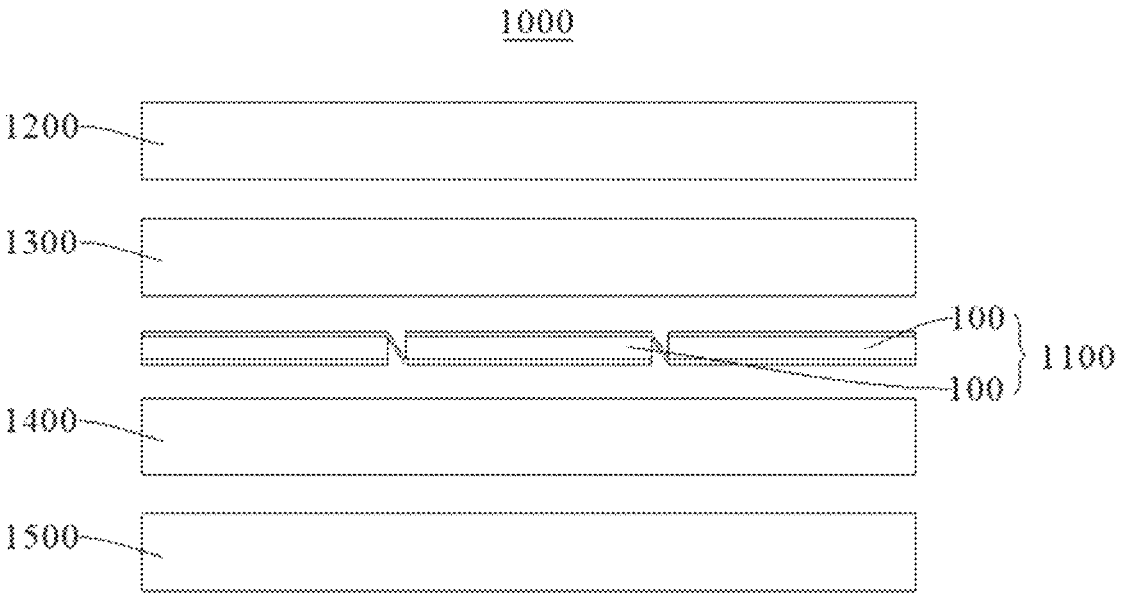
FIG. 3 is a schematic structural diagram of a photovoltaic module provided in an embodiment of the present application.

Referring to FIG. 3, according to some embodiments of the present application, the present application further provides a photovoltaic module 1000 including the perovskite cell 100 provided in any one of the above embodiments.

The photovoltaic module 1000 refers to a solar cell module, that is, an integral module including a plurality of perovskite cells 100. Herein, the module includes several battery strings 1100, and each of the battery strings 1100 includes several perovskite cells 100 connected in series via connectors such as welding strips.

The photovoltaic module 1000, in addition to the battery string 1100, also includes a front glass 1200, a front encapsulation film 1300, a back encapsulation film 1400, a back glass 1500, etc. As an example, the photovoltaic module 1000 includes the front glass 1200, the front encapsulation film 1300, the battery string 1100, the back encapsulation film 1400 and the back glass 1500 which are stacked in sequence along the thickness direction.

According to some embodiments of the present application, the present application further provides a photovoltaic power generation system, which includes several electrically connected photovoltaic modules.

Several refers to a number of two or more.

The photovoltaic power generation system refers to a power generation system that directly converts solar radiation energy into electrical energy using the photovoltaic effect, and is divided into a stand-alone photovoltaic power generation system (Stand-alone PV System) and a grid-connected photovoltaic power generation system (Grid-connected PV System). The stand-alone photovoltaic power generation system is composed of a solar photovoltaic array composed of photovoltaic modules, a battery pack, a charge controller, a power electronic converter (inverter), a load, etc. The grid-connected photovoltaic power generation system consists of a photovoltaic array, a high-frequency DC/DC boost circuit, a power electronic converter (inverter) and a system monitoring part.

According to some embodiments of the present application, the present application further provides an electrical apparatus including the photovoltaic module of the above embodiments, the photovoltaic module being used to supply electric energy to the electrical device.

The electrical device may be in various forms, such as electric vehicles, ships, spacecrafts, solar water heaters, solar energy, etc.

The power supply of the electrical device can be a single power supply from the photovoltaic module, or a power supply from the photovoltaic module in conjunction with an energy storage battery, i.e. the electrical apparatus is installed with both the photovoltaic module and an energy storage battery. The energy storage battery is not limited to a primary and a secondary battery, such as, but not limited to, a lithium-ion secondary battery, a sodium-ion secondary battery, and the like.

Some specific embodiments are listed below to better illustrate the present application.

Example 1

(1) A FTO conductive glass with a specification of 2.0 cm×2.0 cm was washed, on the surface thereof, twice with acetone and isopropanol sequentially, immersed in deionized water for an ultrasonic treatment for 10 min, then dried in a blast drying oven and placed in a glove box (under $N_2$ atmosphere), as a transparent substrate layer.

(2) a 3 wt % SnO2 nano-colloid solution was spin-coated on the front side of the transparent substrate layer 110 at 4000 rpm-6500 rpm, and then heated on a constant temperature hot stage at 150° C. for 15 min to form an electron transport layer with a thickness of 50 nm for use.

(3) A DMF solution containing a 5 mg/mL NaYGd: Er nanocolloid, a 5 wt % tetraethylrhodamine and a 1.5 mol/L $FAPbI_3$ was spin-coated on the front side of the resulting electron transport layer at 3000 rpm-4500 rpm, and then moved to a constant temperature hot stage and heated at 100° C. for 30 min, and then cooled to room temperature, to form a wide absorption spectrum perovskite layer with a thickness of 500 nm.

(4) A chlorobenzene solution containing a 73 mg/mL Spiro-OMeTAD was spin-coated on the front side of the wide absorption spectrum perovskite layer at 3000 rpm-4000 rpm and dried to obtain a hole transport layer with a thickness of 150 nm.

(5) The resulting sheet was placed into an evaporator, for evaporating a metal electrode of Ag on the hole transport layer under a vacuum condition of 5×10-4 Pa to form an electrode layer, where the evaporation rate was 0.1 Å/s, and the thickness of the electrode layer was 80 nm, and a perovskite cell was obtained, followed by edge bead removal for test.

Examples 2-19 and Comparative Example 1

Examples 2-19 and Comparative Example 1 are different from Example 1 only in that the parameters shown in Table 1 are different.

The energy conversion efficiency of the perovskite cells of each of the Examples and Comparative Example was measured under the following test conditions:

Under an atmospheric environment, an AM1.5G standard light source is used as the sunlight simulation light source, and the volt-ampere characteristic curve of the battery under the illumination of the light source is measured by a four-channel digital source meter (Keithley 2440) to obtain the open-circuit voltage Voc, the short-circuit current density Jsc, and the fill factor FF (Fill Factor) of the battery; thus, the energy conversion efficiency Eff (Efficiency) of the battery can be calculated.

The energy conversion efficiency is calculated as follows:

$$Eff = Pout/Popt = Voc \times Jsc \times (Vmpp \times Jmpp)/(Voc \times Jsc) = Voc \times Jsc \times FF,$$

where Pout, Popt, Vmpp, and Jmpp respectively represent the working output power of the battery, the incident light power, the voltage at the largest power point of the battery, and the current at the largest power point of the battery.

Comparative Example 2 is different from Example 18 only in that the wide spectrum absorption perovskite layer is prepared as a composite layer of a down-conversion material layer and a perovskite layer, wherein the down-conversion material layer is located between the electron transport layer and the perovskite layer, and based on the mass of the composite layer composed of the down-conversion material layer and the perovskite layer, the percentage mass content of the down-conversion material in the composite layer is 2.5%.

TABLE 1

| | Test data | | | | | | | |
|---|---|---|---|---|---|---|---|---|
| | Up-conversion material | | Down-conversion material | | Ratio | | | |
| | Component | Percentage mass content in the wide absorption spectrum perovskite layer | Component | Percentage mass content in the wide absorption spectrum perovskite layer | of added mass of up-conversion to down-conversion materials | D90 particle size (nm) | Three-dimensional perovskite component | Energy conversion efficiency Eff(%) |
| Example 1 | NaYGd:Er | 2.5% | Tetraethylrhodamine | 2.5% | 1:1 | 20 | $FAPbI_3$ | 21.7 |
| Example 2 | NaYGd:Er | 2.5% | / | 0 | / | 20 | $FAPbI_3$ | 20.5 |
| Example 3 | NaYGd:Er | 6% | / | 0 | / | 20 | $FAPbI_3$ | 20.3 |
| Example 4 | NaYGd:Er | 10% | / | 0 | / | 20 | $FAPbI_3$ | 20.1 |
| Example 5 | NaYGd:Er | 5% | Tetraethylrhodamine | 2.5% | 2:1 | 20 | $FAPbI_3$ | 21.5 |
| Example 6 | NaYGd:Er | 1% | Tetraethylrhodamine | 2.5% | 1:2.5 | 20 | $FAPbI_3$ | 21.4 |
| Example 7 | NaYGd:Er | 0.5% | Tetraethylrhodamine | 2.5% | 1:5 | 20 | $FAPbI_3$ | 21 |

TABLE 1-continued

Test data

| | Up-conversion material | | Down-conversion material | | Ratio | | | |
|---|---|---|---|---|---|---|---|---|
| | Component | Percentage mass content in the wide absorption spectrum perovskite layer | Component | Percentage mass content in the wide absorption spectrum perovskite layer | of added mass of up-conversion to down-conversion materials | D90 particle size (nm) | Three-dimensional perovskite component | Energy conversion efficiency Eff(%) |
| Example 8 | NaYGd:Er | 6% | Tetraethylrhodamine | 2.5% | 6:2.5 | 20 | $FAPbI_3$ | 21.3 |
| Example 9 | NaYGd:Er | 2.5% | Tetraethylrhodamine | 5% | 1:2 | 20 | $FAPbI_3$ | 21.4 |
| Example 10 | NaYGd:Er | 2.5% | Tetraethylrhodamine | 1% | 2.5:1 | 20 | $FAPbI_3$ | 21.3 |
| Example 11 | NaYGd:Er | 2.5% | Tetraethylrhodamine | 0.5% | 5:1 | 20 | $FAPbI_3$ | 20.9 |
| Example 12 | NaYGd:Er | 2.5% | Tetraethylrhodamine | 6% | 2.5:6 | 20 | $FAPbI_3$ | 21.2 |
| Example 13 | NaYGd:Er | 6% | Tetraethylrhodamine | 6% | 1:1 | 20 | $FAPbI_3$ | 21 |
| Example 14 | NaYGd:Er | 8% | Tetraethylrhodamine | 8% | 1:1 | 20 | $FAPbI_3$ | 20.9 |
| Example 15 | NaYGd:Er | 4.5% | Tetraethylrhodamine | 0.5% | 9:1 | 20 | $FAPbI_3$ | 20.6 |
| Example 16 | NaYGd:Er | 1% | Tetraethylrhodamine | 6% | 1:6 | 20 | $FAPbI_3$ | 20.9 |
| Example 17 | NaYGd:Er | 6% | Tetraethylrhodamine | 1% | 6:1 | 20 | $FAPbI_3$ | 20.8 |
| Example 18 | NaYGd:Er | 2.5% | Tetraethylrhodamine | 2.5% | 1:1 | 30 | $FAPbI_3$ | 21.2 |
| Example 19 | NaYGd:Er | 2.5% | Tetraethylrhodamine | 2.5% | 1:1 | 40 | $FAPbI_3$ | 21 |
| Example 20 | NaYGd:Er | 2.5% | Tetraethylrhodamine | 2.5% | 1:1 | 10 | $FAPbI_3$ | 21.5 |
| Example 21 | / | 0 | Tetraethylrhodamine | 2.5% | / | 20 | $FAPbI_3$ | 20.5 |
| Example 22 | NaGdF4 | 2.5% | Tetraethylrhodamine | 2.5% | 1:1 | 20 | $FAPbI_3$ | 21.3 |
| Example 23 | 4CzIPN | 2.5% | Riboflavin | 2.5% | 1:1 | 20 | $FAPbI_3$ | 21.5 |
| Example 24 | NaYGd:Er | 2.5% | Phycoerythrin | 2.5% | 1:1 | 20 | $FAPbBr_3$ | 21.4 |
| Comparative Example 1 | / | 0 | / | 0 | / | / | $FAPbI_3$ | 19.5 |
| Comparative Example 2 | NaYGd:Er | 2.5% | / | / | / | 20 | $FAPbI_3$ | 20.1 |

In Table 1, the D90 particle size refers to the D90 particle size of the corresponding light up- and/or down-conversion material when the up- and/or down-conversion light materials are in a granular form and dispersed in a three-dimensional perovskite while maintaining a granular morphology. For example, in Example 1, the material refers to the NaYGd: Er nanocolloid. According to Comparative Example 1 and Examples 1-24, it can be seen that the wide absorption spectrum perovskite layer provided in the present application can effectively improve the energy conversion efficiency of the perovskite cell.

According to Example 2 and Comparative Example 2, it can be seen that based on the mass of the wide absorption spectrum perovskite layer, under the premise that the total percentage mass content of the conversion material is the same, the bulk doping provided in the present application can effectively result in the improvement of the energy conversion efficiency compared to the layered configuration.

According to Examples 2-4, it can be seen that in the case of doping only an up-conversion material, the doping amount has a significant effect on the energy conversion efficiency. Based on the mass of the wide absorption spectrum perovskite layer, when the total percentage mass content of the up-conversion material does not exceed 6%, the energy conversion efficiency of the perovskite cell is good. In combination with Example 1 and Examples 5-8, it can be seen that when the total percentage mass content of the up-conversion material is 1-6% based on the mass of the wide absorption spectrum perovskite layer, the energy conversion efficiency of the perovskite cell can be further optimized.

According to Examples 1, and 9-12, based on the mass of the wide absorption spectrum perovskite layer, when the total percentage mass content of the down-conversion material is less than or equal to 6%, the energy conversion efficiency of the perovskite cell is good. Optionally, based on the mass of the wide absorption spectrum perovskite layer, when the total percentage mass content of the down-conversion material is 1-6%, the energy conversion efficiency of the perovskite cell can be further optimized.

According to Example 1 and Examples 13-14, the mass ratio of the up-conversion material to the down-conversion material in the above three Examples is 1:1, but the doping amount changes, resulting in changes in the energy conversion efficiency.

By comparing Example 1 with Example 15, Example 5 with Example 9,Example 6 with Example 10, Example 7 with Example 11, and Example 16 with Example 17, it can be seen that, under the premise that the total doping amount of the conversion material is the same, the mass ratio of the up-conversion material to the down-conversion material will affect the energy conversion efficiency, wherein when the mass ratio of the up-conversion material to the down-conversion material is in the range of 1:6-6:1, the perovskite cell has a better energy conversion efficiency.

According to Examples 1, and 18-20, it can be seen that at least part of the light-conversion material is dispersed in the three-dimensional perovskite in the form of particles, and the selection of the particle size of the particles will also affect the final energy conversion efficiency.

In summary, the perovskite cell, photovoltaic module, photovoltaic power generation system and electrical device provided in the present application can alleviate the technical problems of a low solar spectrum utilization rate and a low energy conversion efficiency of the perovskite cell.

Finally, it should be noted that the above embodiments are only used to illustrate the technical solutions of the present application, rather than to limit it. Although the present application has been described in detail with reference to the aforementioned embodiments, those skilled in the art should understand that they can still modify the technical solutions described in the aforementioned embodiments, or replace some or all of the technical features therein by equivalents. These modifications or replacements do not deviate the essence of the corresponding technical solutions from the scope of the technical solutions of the embodiments of the present application, and they should all be included in the scope of the claims and specification of the present application. In particular, the technical features mentioned in the various embodiments can be combined in any manner as long as there is no structural conflict. The present application is not limited to the particular embodiments disclosed herein, but rather includes all technical solutions falling within the scope of the claims.

What is claimed is:

1. A perovskite cell, comprising: a wide absorption spectrum perovskite layer located between a transparent substrate layer and an electrode layer, wherein the wide absorption spectrum perovskite layer comprises a three-dimensional perovskite and a light-conversion material, the light-conversion material is in a granular form and dispersed in the three-dimensional perovskite while maintaining a granular morphology, at least part of the light-conversion material is distributed in intergranular gaps of the three-dimensional perovskite, and the light-conversion material comprises an up-conversion material and a down-conversion material, wherein the up-conversion material comprises NaYGd and Er, the down-conversion material comprises at least one selected from tetraethyl rhodamine, Riboflavin, and Phycoerythrin.

wherein, based on a mass of the wide absorption spectrum perovskite layer, a percentage mass content of the down-conversion material is 1%-6%, a percentage mass content of the up-conversion material is 1%-6%.

2. The perovskite cell according to claim 1, wherein a mass ratio of the up-conversion material to the down-conversion material is 1:6-6:1.

3. The perovskite cell according to claim 1, wherein the up-conversion material is capable of converting light with a wavelength greater than 800 nm into visible light with a wavelength less than 800 nm.

4. The perovskite cell according to claim 1, wherein the up-conversion material further comprises at least one of the following components: $NaLuF_4$, $NaGdF_4$, $NaYbF_4$, NaYLu, NaYNd, $NaGd(WO_4)_2$, LiErF, $BaYF_5$, $BaLuF_5$, $BaGdF_5$, $BaYb_2F$, CaS, $LiLa(MoO_4)_2$, $Gd_2O_3$, ZrYO, YAIO, $CaWO_4$, 2,4,5,6-tetrakis(9H-carbazol-9-yl)isophthalonitrile, thioxanthone, triphenylamine, and a rare earth element dopant and derivative of each of the above components.

5. The perovskite cell according to claim 1, wherein the down-conversion material is capable of converting light with a wavelength less than 400 nm into visible light with a wavelength greater than 400 nm.

6. The perovskite cell according to claim 1, wherein the down-conversion material futher comprises at least one of a phosphorescent material, and a thermally activated delayed fluorescent material.

7. The perovskite cell according to claim 6, wherein the down-conversion material material further comprises at least one of the following components: a metal complex, a polyfluorene compound, a coumarin compound, a naphthalimide compound, a triacene or higher acene compound, a fluorescein compound, a fluoroboron-dipyrrole compound, a resorufin compound, a pyrazoline compound, a triphenylamine compound, a carbazole compound, a green fluorescent protein, a diamine fluorescent compound, and a perovskite luminescent nanomaterial.

8. The perovskite cell according to claim 6, wherein the phosphorescent material comprises a matrix and an activator, the matrix comprises at least one of a sulfide, an oxide, a selenide, a fluoride, a phosphate, a silicate and a tungstate of a Group II metal, and the activator comprises a heavy metal.

9. The perovskite cell according to claim 8, wherein in the phosphorescent material, the heavy metal comprises at least one of Au, Cu, Mn, Ag, Bi, Pb and a rare earth metal.

10. The perovskite cell according to claim 1, wherein a thickness of the wide absorption spectrum perovskite layer is 400-600 nm.

11. The perovskite cell according to claim 1, wherein the absorption spectrum of the wide absorption spectrum perovskite layer is 300-1100 nm.

12. The perovskite cell according to claim 1, wherein the perovskite cell comprises the transparent substrate layer, a first carrier transport layer, the wide absorption spectrum perovskite layer, a second carrier transport layer and the electrode layer stacked in sequence; and either the first carrier transport layer or the second carrier transport layer is an electron transport layer, and the other is a hole transport layer.

13. A photovoltaic module, comprising the perovskite cell according to claim 1.

14. A photovoltaic power generation system, comprising several electrically connected photovoltaic modules according to claim 13.

15. An electrical device, comprising several electrically connected photovoltaic modules according to claim 13.

* * * * *